United States Patent [19]
Wakata et al.

[11] Patent Number: 5,124,234
[45] Date of Patent: Jun. 23, 1992

[54] LIQUID LIGHT-SENSITIVE RESIN COMPOSITION

[75] Inventors: Yuichi Wakata; Minoru Maeda; Masayuki Iwasaki, all of Shizuoka, Japan

[73] Assignee: Fuji Photo Film Co., Ltd., Japan

[21] Appl. No.: 715,709

[22] Filed: Jun. 17, 1991

Related U.S. Application Data

[63] Continuation of Ser. No. 467,466, Jan. 19, 1990, abandoned.

[30] Foreign Application Priority Data

Jan. 20, 1989 [JP] Japan .................................. 1-11262
Jan. 20, 1989 [JP] Japan .................................. 1-11263

[51] Int. Cl.$^5$ ............................................. C03C 1/68
[52] U.S. Cl. ..................................... 430/280; 430/285; 522/120; 522/170; 522/188
[58] Field of Search ................. 430/285, 283; 522/120, 522/170, 188

[56] References Cited

U.S. PATENT DOCUMENTS 4,933,259 6/1990 Chihara et al. ...................... 450/280

*Primary Examiner*—Jack P. Brammer
*Attorney, Agent, or Firm*—Sughrue, Mion, Zinn, Macpeak & Seas

[57] ABSTRACT

A liquid light-sensitive resin composition comprising:
(A) a modified polystyrene resin which has at least one styrene unit having at least one ethylenic unsaturated double bond and at least one carboxyl group;
(B) a polymerizable compound having at least one ethylenic unsaturated double bond;
(C) a compound having at least one epoxy group;
(D) a photopolymerization initiator or a photopolymerization initiating system;
(E) a thermohardening catalyst capable of inducing a thermal reaction of the at least one epoxy group; and
(F) an organic solvent; is disclosed. This liquid light-sensitive resin composition can form a bubble-free light-sensitive resin layer of a uniform thickness on a printed circuit board; allows both of photohardening and thermohardening by heating the printed circuit board, on which the light-sensitive resin composition has been applied, prior to the exposure so as to lower the tackiness of the surface coated with the light-sensitive resin composition and adhering the film and a pattern mask followed by exposure; is highly sensitive; gives a film excellent in electrical properties, mechanical properties and chemical resistance after hardening; and can be developed with an alkaline aqueous solution.

5 Claims, No Drawings

LIQUID LIGHT-SENSITIVE RESIN COMPOSITION

This is a continuation of application Ser. No. 07/467,466 filed Jan. 19, 1990, now abandoned.

FIELD OF THE INVENTION

This invention relates to a liquid light-sensitive resin composition. More particularly, it relates to a liquid light-sensitive resin composition capable of both photohardening and thermohardening, which is used in the formation of a permanent protective mask such as a solder resist for a printed circuit board and is highly sensitive to UV exposure and imparts to a film excellent electrical properties and a high chemical resistance after hardening.

BACKGROUND OF THE INVENTION

Known resin compositions employed in the field of printed circuit boards used in the formation of a permanent protective mask such as a solder resist or chemical plating resist comprise thermohardenable resins such as epoxy or melamine resins as the main component. Screen printing has been frequently used for the formation of patterns. The major object in the use of a solder resist is to limit the region to be soldered, to prevent the formation of a solder bridge, to prevent the corrosion of a conductor and to maintain the electrical insulating properties between conductors.

However, recent development in very large scale integrations have made it necessary to shorten the distance between conductors. Thus, it is now required to achieve higher electrical insulating properties as well as higher dimensional accuracy of, for example, a solder resist. However, screen printing inherently has a low degree of resolution and is accompanied by some problems such as skip and pinhole in the case of a highly viscous ink, or bleeding, running and sagging in the case of a less viscous ink. Therefore, it is impossible to satisfactorily accommodate the development of high-density printed circuit boards by screen printing.

Under these circumstances, a light-sensitive resin composition, which enables the formation of a pattern by photography wherein an image is formed by exposure followed by development, has a high sensitivity as well as a high degree of resolution, shows an excellent adhesion to a substrate and gives a film excellent in electrical and mechanical properties after hardening, attracts public attention today.

Further, it has been recently required to develop a light-sensitive resin composition capable of being developed with an alkaline aqueous solution or water, by taking the working environment and air- and water-pollution into consideration.

Dry-film type or liquid-type light-sensitive resin compositions capable of being developed have been known as a permanent protective mask for a printed circuit board for pattern-formation.

Examples of light-sensitive resin compositions of the dry film type include a light-sensitive resin composition comprising urethane di(meth)acrylate, a linear polymer compound and a photosensitizer disclosed in JP-A-57-55914 (the term "JP-A" as used herein means an "unexamined published Japanese Patent Application") (corresponding to U.S. Pat. No. 4,499,163) and another one comprising a (meth)acryl-modified resin of a specific novolak epoxy resin and a photosensitizer disclosed in JP-A-62-247353.

Generally speaking, however, light-sensitive resin compositions of the dry film type would frequently suffer from the formation of bubbles upon hot contact bonding and be unsatisfactory in thermal stability and adhesion. As JP-A-52-52703 (corresponding to U.S. Pat. No. 4,101,364) teaches, a specific process such as hot contact bonding under reduced pressure is required in order to overcome these problems. Furthermore, it is not always possible to establish a perfect thermal resistance or adhesion even though the above mentioned specific process is employed.

On the other hand, liquid light-sensitive resin compositions capable of being developed are suitable for, e.g., a permanent protective mask for a printed circuit board having narrow intervals of conductors. Such a liquid light-sensitive resin composition is applied as such onto a printed circuit board immediately before use and thus requires less steps. Furthermore, it can be applied to a highly uneven printed circuit board so as to form an excellent image.

However, these liquid light-sensitive resin compositions are disadvantageous in that the direct adhesion of a printed circuit board, to which a liquid light-sensitive resin composition have been applied, to a pattern mask followed by development causes stains on the pattern mask.

In order to overcome this problem, i.e., stains on a pattern mask, JP-A-57-164595 disclosed a specific process comprising placing a pattern mask at a specific distance apart from a printed circuit board, on which a liquid light-sensitive resin composition is applied as such without drying, hardening the liquid light-sensitive resin composition through exposure and then removing the unhardened liquid light-sensitive resin composition, which is different from a common process of applying a liquid light-sensitive resin composition onto a printed circuit board and drying it to thereby form a film. However this process is disadvantageous in that the surface of the applied liquid light-sensitive resin composition, which is not dried for film-formation, should be placed at a distance from the pattern mask, which lowers the degree of resolution. Furthermore, this process requires use of a specific device, which increases the cost.

Furthermore, JP-A-58-24144 and JP-A-59-2049 each disclose a process for the production of a solder resist which comprises applying a liquid light-sensitive resin composition onto a transparent and flexible substrate or pattern mask capable of transmitting active light in such a manner as to give a uniform thickness; immediately transporting the flexible substrate or pattern mask; pressing the surface of the substrate or pattern mask, on which the liquid light-sensitive resin composition has been applied, toward a printed circuit board under a constant pressure to thereby laminate the liquid light-sensitive resin composition onto the printed circuit board at a constant thickness; and then conducting the development through exposure by peeling the flexible substrate or pattern mask. However this process has some disadvantages. When the liquid light-sensitive resin composition applied on the flexible substrate or pattern mask at a uniform thickness is pressed toward the printed circuit board under a constant pressure, the unevenness of the printed circuit board causes the rolling-in of bubbles. As a result, the image thus formed involves a considerable number of bubbles. Further, this process is unsatisfactory from the viewpoints of thermal resistance and adhesion. Furthermore, it requires the use of a specific device, which increases the cost.

Furthermore, JP-A-61-102652 and JP-A-62-27736 each disclose a process for the production of a solder resist which comprises applying a liquid light-sensitive resin composition onto a printed circuit board, pressing a transparent and flexible substrate or pattern mask toward the liquid light-sensitive resin composition applied on the printed circuit board under constant pressure, exposing the liquid light-sensitive resin composition to light through the pattern mask, and developing the same after peeling the flexible substrate or pattern mask. However, this process also suffers from some problems. For example, it requires specific devices for pressing the flexible substrate or pattern mask under constant pressure and for the exposure, which increases the cost.

When the above-mentioned liquid light-sensitive resin composition is not dried but exposed to light as such according to the resist pattern, the liquid light-sensitive resin composition, which comprises a liquid prepolymer containing a number of reactive monomers, is inferior in properties including acid resistance and chemical resistance to those observed in common methods.

A process is known for the production of a solder resist which comprises applying a liquid light-sensitive resin composition, drying the same by heating, adhering a pattern mask thereto and developing the same through exposure. Examples of liquid light-sensitive resin compositions used in this process include the one using a reaction product obtained by reacting a novolak epoxy resin with an unsaturated monobasic acid as disclosed in JP-A-62-7773 and JP-A-62-7774 (both corresponding to EP-A-0207188) or the one disclosed in JP-B-52-34935 (the term "JP-B" as used herein means an "examined Japanese Patent Publication") (corresponding to U.S. patent application Ser. No. 06/426,877 filed on Dec. 20, 1973).

On the other hand, it has been recently required to develop a light-sensitive resin composition capable of being developed with an alkaline solution or water, by taking the working environment and air- and water-pollution into consideration. Examples such resin composition include a liquid resist ink composition disclosed in JP-A-61-243869 which comprises a novolak epoxy compound and a reaction product obtained by reacting an unsaturated monocaboxylic acid with a polybasic acid anhydride, a liquid resin composition disclosed in JP-A-62-187722 which comprises a bisphenol epoxy resin having an unsaturated group and a carboxyl group as the major component, the composition which comprises the urethane compound having a terminal unsaturated group at a terminal of the molecule thereof and a terminal carboxyl group at the other terminal as disclosed in JP-A-57-164595 (corresponding to U.S. patent application Ser. No. 06/225810) and the composition which comprises a carboxy-modified epoxy (meth)acrylate as disclosed in U.S. Pat. No. 4,789,620. Further, the similar modified product of the novolak resin or epoxy resin as mentioned above is disclosed, for example, in JP-B-52-34935 and U.S. Pat. No. 3,980,483 or U.S. Pat. No. 4,789,620, respectively. Furthermore, light-sensitive resin compositions and components which can be used therefor have been disclosed in prior arts. For instance, a polymerizable compound having an ethylenic unsaturated double bond is disclosed, for example, in JP-B-52-34935 (corresponding to U.S. patent application Ser. No. 06/426,877 filed on Dec. 20, 1973), and a specific compound thereof is disclosed, for example, in U.S. Pat. Nos. 4,322,491, 4,604,342, OLS 2064079 and JP-A-61-228007; an epoxy compound is disclosed, for example, in JP-A-61-243869 and U.S. Patent 4,485,166; a photopolymerization initiator is disclosed, for example, in JP-A-53-133428, JP-B-57-1819, JP-B-57-6069 and U.S. Pat. No. 3,615,455; an catalyst is disclosed, for example, in JP-A-61-243869.

However, these liquid light-sensitive resin compositions are also unsatisfactory in sensitivity and in the electrical properties and chemical resistance of the films obtained after hardening.

SUMMARY OF THE INVENTION

The present invention solves the above-mentioned technical problems and provides a liquid light-sensitive resin composition which can form a bubble-free sensitive resin layer of a uniform thickness on a printed circuit board; allows both photohardening and thermohardening by heating the printed circuit board, on which the light-sensitive resin composition has been applied, prior to exposure so as to lower the tackiness of the surface coated with the light-sensitive resin composition and adhering the film and a pattern mask followed by exposure; is highly sensitive; gives a film excellent in electrical properties, mechanical properties and chemical resistance after hardening; and can be developed with an alkaline aqueous solution.

We have discovered that the above problems can be solved by using the following liquid light-sensitive resin composition, thus completing the present invention:

(A) a modified polystyrene resin which has at least one styrene unit having at least one ethylenic unsaturated double bond and at least one carboxyl group;

(B) a polymerizable compound having at least one ethylenic unsaturated double bond;

(C) a compound having at least one epoxy group;

(D) a photopolymerization initiator or a photopolymerization initiating system;

(E) a thermohardening catalyst capable of inducing a thermal reaction of the at least one epoxy group; and (F) an organic solvent.

As the modified polystyrene resin (A), (A-1) a modified polystyrene resin obtained by reacting a polymer having a repeating unit of the following general formula (I):

wherein R represents a hydrogen atom or a methyl group; and Ar represents an unsubstituted or substituted phenylene group;

successively with a compound having an epoxy group and an ethylenic unsaturated double bond in a single molecule and a saturated or unsaturated polybasic acid anhydride; and/or (A-2) a modified polystyrene resin obtained by reacting a polymer having a repeating unit of the following general formula (II):

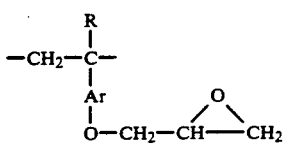

(II)

wherein R represents a hydrogen atom or a methyl group; and Ar represents an unsubstituted or substituted phenylene group;
successively with a compound having a carboxyl group and an ethylenic unsaturated double bond in a single molecule and a saturated or unsaturated polybasic acid anhydride; are preferable.

DETAILED DESCRIPTION OF THE INVENTION

Each component of the liquid light-sensitive resin composition of the present invention will be described below.

The modified polystyrene resin (A-1) may be obtained by reacting a polymer having the repeating unit of the general formula (I) successively with a compound having an epoxy group and an ethylenic unsaturated double bond in a single molecule and a saturated or unsaturated polybasic acid anhydride.

In the general formulae (I) and (II) above, both Ar represent an unsubstituted or substituted phenylene group. Examples of the substituted phenylene group include:

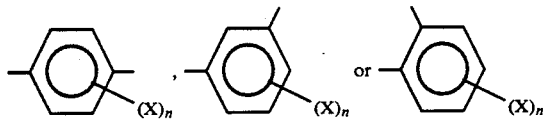

wherein X represents a halogen atom, $NO_2$, a lower alkyl group (e.g., methyl, ethyl, propyl, isopropyl, butyl, isobutyl, t-butyl, sec-butyl) or $CH_2OH$ and n means an integer of from 1 to 4.

Examples of the polymer having the repeating unit of the general formula (I) include homopolymers of, for example, 4-vinylphenol, 4-isopropenylphenol, 2-ethyl-4-vinylphenol, 2-isopropyl-4-vinylphenol, 2,6-diisopropyl-4-vinylphenol, 2,6-di-t-butyl-4-vinylphenol, 2,6-di-t-butyl-4-isopropenylphenol, brominated 4-vinylphenol and brominated 4-isopropenylphenol, and copolymers of these monomers together with monomers copolymerizable therewith. Examples of the monomers copolymerizable with the monomers having the repeating unit of the general formula (I), as cited above, include acrylonitrile, methyl methacrylate, methyl acrylate, ethyl methacrylate, ethyl acrylate, styrene, vinyltoluene, α-methylstyrene, dimethyl maleate, diethyl maleate and N-alkylmaleimide in which the alkyl may be methyl, ethyl, phenyl, etc. Among these polymers, poly(4-vinylphenol), poly(4-isopropenylphenol), 4-isopropenylphenol/acrylonitrile copolymers and 4-vinylphenol/methyl methacrylate copolymers are particularly preferable.

Examples of the compound having an epoxy group and an ethylenic unsaturated double bond in a single molecule include epoxyalkyl (meth)acrylates such as glycidyl acrylate, glycidyl methacrylate, 3,4-epoxybutyl methacrylate, 3,4-epoxybutyl- methacrylate, 4,5-epoxypentyl acrylate, 4,5-epoxypentyl methacrylate, 5,6-epoxyhexyl acrylate, 5,6-epoxyhexyl methacrylate, 6,7-epoxyheptyl acrylate, 6,7-epoxyheptyl methacrylate, 10,11-epoxyundecyl acrylate, 10,11-epoxyundecyl methacrylate, 4-glycidylcyclohex-yl acrylate and 4-glycidylcyclohexyl methacrylate. Further, an adduct (1 : 1) of a diglycidyl ether compound with (meth)acrylic acid may be used. Examples of the diglycidyl ether include bisphenol A diglycidyl ether, ethylene glycol diglycidyl ether, propylene glycol diglycidyl ether, tetramethylene glycol diglycidyl ether and diethylene glycol diglycidyl ether. Further, a monoglycidyl ether mono(meth)acrylate of a diol may be used. Examples of the diol include bisphenol A, ethylene glycol, propylene glycol, tetramethylene glycol, diethylene glycol, dipropylene glycol and ditetramethylene glycol. Furthermore, a monoglycidyl ester mono(meth)acryloxyethyl ester of a dicarboxylic acid may be used. Examples of the dicarboxylic acid include phthalic acid, cyclohexene dicarboxylic acid, cyclohexane dicarboxylic acid, maleic acid, malonic acid and succinic acid. Furthermore, 1-chloro-2,3-epoxypropyl acrylate, 1-chloro-2,3-epoxypropyl methacrylate, 2-bromo-3,4-poxybutyl acrylate, 2-bromo-3,4-epoxybutyl methacrylate, 2-(epoxyethyloxy)-ethyl- acrylate, 2-(epoxyethyloxy)ethyl methacrylate, 2-(3,4-epoxybutyloxy)ethyl acrylate and 2-(3,4-epoxybutyloxy)-ethyl- methacrylate may be used therefor. Among these materials, glycidyl acrylate and glycidyl methacrylate are particularly preferable.

Examples of the saturated or unsaturated polybasic acid anhydride include dibasic acid anhydrides such as succinic anhydride, methylsuccinic anhydride, 2,3-dimethylsuccinic anhydride, 2,2-dimethylsuccinic anhydride, ethylsuccinic anhydride, dodecenylsuccinic anhydride, nonenylsuccinic anhydride, maleic anhydride, methylmaleic anhydride, 2,3-dimethylmaleic anhydride, 2-chloromaleic anhydride, 2,3- dichloromaleic anhydride, bromomaleic anhydride, itaconic anhydride, citraconic anhydride, cis-aconitic anhydride, phthalic anhydride, tetrahydrophthalic anhydride, tetrachlorophthalic anhydride, tetrabromophthalic anhydride, hexahydrophthalic anhydride, methyl tetrahydrophthalic anhydride, methyl hexahydrophthalic anhydride, endomethylene tetrahydrophthalic anhydride, methyl endomethylene tetrahydrophthalic anhydride, chlorendic anhydride and 5-(2,5-dioxotetrahydrofuryl)-3-methyl-3-cyclohexene-1,2-dicarboxylic anhydride, and polybasic acid anhydrides such as trimellitic anhydride and 3,3',4,4'-benzophenone tetracarboxylic acid. Among these materials, the above-mentioned dibasic acid anhydrides are preferable and succinic anhydride and tetrahydrophthalic anhydride are particularly preferable.

These materials are successively reacted at the following ratio to thereby give the desired modified polystyrene resin. Namely, from about 0.5 to 1.2 equivalent, preferably from about 0.8 to 1.1 equivalent, of the compound having an epoxy group and an ethylenic unsaturated double bond in a single molecule and from about 0.1 to 1.1 equivalent, preferably from about 0.3 to 1.0 equivalent of the polybasic acid anhydride may be used per equivalent of the hydroxyl group in the polymer having the repeating unit of the general formula (I). When the amount of the compound having an epoxy group and an ethylenic unsaturated double bond in a molecule is less than about 0.5 equivalent, the resulting liquid light-sensitive resin composition has a poor sensitivity. When the amount thereof exceeds about 1.2 equivalent, on the other hand, the resulting liquid light-sensitive resin composition has an undesirable tackiness. When the amount of the polybasic acid anhydride is less than about 0.1 equivalent, the resulting liquid light-sensitive resin composition has a low degree of resolution and suffers from gelation of the resin. When the amount of the same exceeds about 1.1 equivalent, on the other hand, the resulting liquid light-sensitive resin composition has an undesirable tackiness or suffers from precipitation of crystals.

The reaction of the polymer having the repeating unit of the general formula (I) with the compound having an epoxy group and an ethylenic unsaturated double bond in a single molecule can be conducted by the manner as disclosed, for example, in Eiichi Masuhara et al., *Yukigoseikagaku Kyokaishi* vol. 33(1), page 52 (1975).

The reaction of the reaction product obtained above with the acid anhydride can be conducted by referring the manner of the modification of novolak resin as disclosed, for example, in JP-A-61-243896 and U.S. Pat. No. 3,980,483.

These compounds can be used either alone or mixtures of two or more of them as the modified polystyrene resin (A-1).

The modified polystyrene resin (A-2) may be obtained by reacting a polymer having the repeating unit of the general formula (II) successively with a compound having a carboxyl group and an ethylenic unsaturated double bond in a single molecule and a saturated or unsaturated polybasic acid anhydride.

Examples of the polymer having the repeating unit of the general formula (II) include vinyl homopolymers of, for example, 4-vinylphenyl glycidyl ether, 4-isopropenyphenyl glycidyl ether, 2-ethyl-4-vinylphenol glycidyl ether, 2-isopropyl-4-vinylphenyl glycidyl ether, 2,6-diisopropyl-4-vinylphenyl glycidyl ether, 2,6-di-t-butyl-4-vinylphenyl glycidyl ether, 2,6-di-t-butyl-4-isopropenylphenyl glycidyl ether, brominated 4-vinylphenyl glycidyl ether and brominated 4-isopropenylphenyl glycidyl ether, and vinyl copolymers of these monomers together with vinyl monomers copolymerizable therewith. Examples of the vinyl monomers copolymerizable with the monomers having the repeating unit of the general formula (II), as cited above, include acrylonitrile, methyl methacrylate, methyl acrylate, ethyl methacrylate, ethyl acrylate, styrene, vinyltoluene, α-methylstyrene, dimethyl maleate, diethyl maleate and N-alkylmaleimide in which the alkyl may be methyl, ethyl, phenyl, etc. These compounds may be obtained by reacting a homopolymer of, for example, 4-vinylphenol, 4-isopropenylphenol, 2-ethyl-4-vinylphenol, 2-isopropyl-4-vinylphenol, 2,6-diisopropyl-4-vinylphenol, 2,6-di-t-butyl-4-vinylphenol, 2,6-di-t-butyl-4-isopropenyl phenol, brominated 4-vinylphenol or brominated 4-phenol or a copolymer of such a monomer as cited above with a monomer copolymerizable therewith with epichlorohydrin in the presence of an alkali. Among these materials, a vinyl polymer of 4-vinylphenyl glycidyl ether and a vinyl polymer of 4-isopropenylphenyl glycidyl ether are particularly preferable.

Examples of the compound having a carboxyl group and an ethylenic unsaturated double bond in a single molecule include acrylic acid, methacrylic acid, dimer, trimer or higher polymers of acrylic acid, a product obtained by reacting acrylic or methacrylic acid with a cyclic acid anhydride such as caprolactone, a product obtained by reacting a hydroxyalkyl acrylate or methacrylate with a dibasic acid anhydride, a product obtained by reacting a hydroxyalkyl acrylate or methacrylate with a halogen-containing carboxylic acid and vinylbenzoic acid.

Furthermore, commercially available products may be used therefor. Examples thereof include Aronix M-5300, M-5400, M-5500 and M-5600 (mfd. by Toa Gosei Kagaku Kogyo K.K.), NK Ester CB-1 and CBX11 (mfd. by Shin Nakamura Kagaku Kogyo K.K.), HOA-MP and HOA-MS (mfd. by Kyoeisha Yushi Kagaku Kogyo K.K.) and Biscoat #2100 (mfd. by Osaka Yuki Kagaku Kogyo K.K.).

Among these materials, acrylic acid, methacrylic acid and dimers, trimers or higher polymers of acrylic acid are particularly preferable.

Examples of the saturated or unsaturated polybasic acid anhydride include dibasic acid anhydrides such as succinic anhydride, methylsuccinic anhydride, 2,3-dimethylsuccinic anhydride, 2,2-dimethylsuccinic anhydride, ethylsuccinic anhydride, dodecenylsuccinic anhydride, nonenylsuccinic anhydride, maleic anhydride, methylmaleic anhydride, 2,3-dimethylmaleic anhydride, 2-chloromaleic anhydride, 2,3-dichloromaleic anhydride, bromomaleic anhydride, itaconic anhydride, citraconic anhydride, cis-aconitic anhydride, phthalic anhydride, tetrahydrophthalic anhydride, tetrachlorophthalic anhydride, tetrabromophthalic anhydride, hexahydrophthalic anhydride, methyl tetrahydrophthalic anhydride, methyl hexahydrophthalic anhydride, endomethylene tetrahydrophthalic anhydride, methyl endomethylene tetrahydrophthalic anhydride, chlorendic anhydride and 5-(2,5-dioxotetrahydrofuryl)-3-methyl-3-cyclohexene-1,2-dicarboxylic anhydride, and polybasic acid anhydrides such as trimellitic anhydride and 3,3′,4,4′-benzophenone tetracarboxylic acid. Among these materials, the above-mentioned dibasic acid anhydrides are preferable and succinic anhydride and tetrahydrophthalic anhydride are particularly preferable.

These materials are successively reacted at the following ratio to thereby give the desired modified polystyrene resin. Namely, from about 0.5 to 1.2 equivalent, preferably from about 0.8 to 1.1 equivalent, of the compound having a carboxyl group and an ethylenic unsaturated double bond in a single molecule and from about 0.1 to 1.1 equivalent, preferably from about 0.3 to 1.0 equivalent of the polybasic acid anhydride may be used per equivalent of the hydroxyl group in the polymer having the repeating unit of the general formula (II). When the amount of the compound having a carboxyl group and an ethylenic unsaturated double bond in a molecule is less than about 0.5 equivalent, the resulting liquid light-sensitive resin composition has a poor sensitivity. When the amount thereof exceeds about 1.2 equivalent, on the other hand, the resulting liquid light-sensitive resin composition has an undesirable tackiness. When the amount of the polybasic acid anhydride is less than about 0.1 equivalent, the resulting liquid light-sensitive resin composition has a low degree of resolution and suffers from the gelation of the resin. When the amount of the same exceeds about 1.1 equivalent, on the other hand, the resulting liquid light-sensitive resin composition has an undesirable tackiness or suffers from precipitation of crystals.

The reaction for obtaining the modified styrene resin can be conducted by referring the manner of the modification of novolak resin as disclosed, for example, in JP-A-61-243869 and U.S. Pat. No. 4,980,483.

These compounds can be used either alone or a mixture of two or more of them as the modified polystyrene resin (A-2).

Either one of these modified polystyrene resins (A-1) or (A-2) or a mixture thereof can be used.

Further a modified polystyrene resin other than those described above can be used in the liquid light-sensitive resin composition of the present invention. Examples thereof include:

(a) The modified polystyrene resin obtained by reacting a polymer having the repeating unit

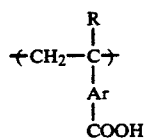

with a compound having at least one epoxy group and a polymeric double bond, and an acid anhydride;

(b) The modified polystyrene resin obtained by reacting a polymer having the repeating unit

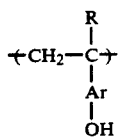

with a compound having an acid anhydride ring and a polymeric double bond; and (c) The modified polystyrene resin obtained by reacting a by reacting a polymer having the repeating unit

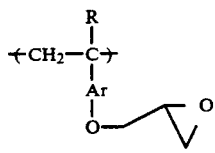

with a compound having a phenolic hydroxy group and a polymeric double bond, and an acid anhydride.

It is preferable to use the modified polystyrene resin(s) in an amount of from about 10 to 60 parts by weight, more preferably from about 20 to 50 parts by weight, based on 100 parts by weight of the solid components of the liquid-light-sensitive resin composition. When the amount of the same is less than about 10 parts by weight, the resulting liquid light-sensitive resin composition has poor development properties and the film obtained therefrom has low strength. When it exceeds about 60 parts by weight, on the other hand, the excessively high viscosity of the liquid lowers the workability.

As the polymerizable compound having at least one ethylenic unsaturated double bond to be used in the present invention, acrylate or methacrylate of a monohydric or polyhydric alcohol may be used.

Examples of the monohydric alcohol in the acrylate or methacrylate of the monohydric alcohol include methanol, ethanol, propanol, isopropanol, n-butanol, isobutanol, t-butanol, cyclohexyl alcohol, benzyl alcohol, octyl alcohol, 2-ethyl hexanol, lauryl alcohol, n-decanol, undecanol, cetyl alcohol, stearyl alcohol, methoxyethyl alcohol, ethoxyethyl alcohol, butoxyethyl alcohol, polyethylene glycol monomethyl alcohol, polyethylene glycol monoethyl alcohol, 2-hydroxy-3-chloropropane, dimethylamino alcohol, diethylamino alcohol, glycidol, 2-trimethoxysilyl ethanol, ethylene chlorohydrin, ethylene bromohydrin, 2,3-dibromo propanol, allyl alcohol, oleyl alcohol, epoxystearyl alcohol, phenol and naphthol. Examples of the polyhydric alcohol thereof include ethylene glycol, 1,2-propanediol, 1,3-propanediol, 1,4-butanediol, 1,5-pentanediol, hexanediol, heptanediol, octanediol, nonanediol, dodecanediol, neopentyl glycol, 1,10-decanediol, 2-butene-1,4-diol, 2-n-butyl-2-ethyl propanediol, cycloheptanediol, 1,4-cyclohexanedimethanol, 3-cyclohexene-1,1-diethanol, polyethylene glycol (e.g., diethylene glycol, triethylene glycol), polypropylene glycol (e.g., dipropylene glycol, tripropylene glycol), polystyrene oxide glycol, polytetrahydrofuran glycol, xylilenediol, bis($\beta$-hydroxyethoxy)benzene, 3-chloro-1,2-propanediol, 2,2-dimethyl-1,3-propanediol, 2,2-diethyl-1,3-propanediol, 2,2-diphenyl-1,3-propanediol, decalindiol, 1,5-dihydroxy-1,2,3,4-tetrahydronaphthalene, 2,5-dimethyl-2,5-hexanediol, 2-ethyl-1,3-hexanediol, 2-ethyl-2-(hydroxymethyl)-1,3-propanediol, 2-ethyl-2-methyl-1,3-propanediol, 3-hexene-2,5-diol, hydroxybenzyl alcohol, 2-methyl-1,4-butanediol, 2-methyl-2,4-pentanediol, 1-phenyl-1,2-ethanediol, 2,2,4,4-tetramethyl-1, 3-cyclobutanediol, 2,3,5,6-tetramethyl-p-xylene-$\alpha$,$\alpha'$-diol, 1,1,4,4-tetraphenyl-2-butyn-1,4-diol, 1,1'-bi-2-naphthol, dihydroxynaphthalene, 1,1'-methylene-di-2-naphthol, biphenol, 2,2-bis(4-hydroxyphenyl)butane, 1,1-bis(4-hydroxyphenyl)cyclohexane, bis(hydroxyphenyl)methane, catechol, resorcinol, 2-methylresorcinol, 4-chlororesorcinol, pyrogallol, $\alpha$-(1-aminoethyl)-p-hydroxybenzyl alcohol, 2-amino-2-methyl-1,3-propanediol, 2-amino-2-ethyl-1,3-propanediol, 3-amino-1,2-propanediol, N-(3-aminopropyl)-diethanolamine, N,N-bis(2-hydroxyethyl)piperazine, 1,3-bis(hydroxymethyl)urea, 1,2-bis(4-pyridyl)-1,2-ethanediol, N-n-butyldiethanolamine, diethanolamine, N-ethyldiethanolamine, 3-mercapto-1,2-propanediol, 3-piperidine-1,2-propanediol, 2-(2-pyridyl)-1,3-propanediol, $\alpha$-(1-aminoethyl)-p-hydroxybenzyl alcohol, glycerol, trimethylolethane, trimethylolpropane, pentaerythritol, dipentaerythritol, tripentaerythritol, sorbitol, glucose, $\alpha$-mannitol, butanetriol, 1,2,6-trihydroxyhexane, 1,2,4-benzenetriol, triethanolamine and 2,2-bis(hydroxymethyl)-2,2',2"-nitrilotriethanol. Among these acrylates and methacrylates of monohydric and polyhydric alcohols, ethylene glycol diacrylate, ethylene glycol dimethacrylate, polyethylene glycol diacrylate, polyethylene glycol dimethacrylate, pentaerythritol triacrylate, pentaerythritol trimethacrylate, pentaerythritol tetraacrylate, pentaerythritol tetramethacrylate, dipentaerythritol hexaacrylate, dipentaerythritol hexamethacrylate, dipentaerythritol pentaacrylate, dipentaerythritol pentamethacrylate, glycerol triacrylate, glycerol trimethacrylate, trimethylolpropane triacrylate, trimethylolpropane trimethacrylate, trimethylolethane triacrylate, trimethylolethane trimethacrylate, neopentylglycol diacrylate, neopentylglycol dimethacrylate, sorbitol hexaacrylate, sorbitol hexamethacrylate, sorbitol pentaacrylate and sorbitol pentamethacrylate are particularly preferable.

Furthermore, acrylamides or methacyrlamides of monoamines or polyamines may be used therefor. Examples of the monoamines include alkylamines such as ethylamine, butylamine, amylamine, hexylamine, octylamine, cyclohexylamine and 9-aminodecaline; monoalkenylamines such as allyamine, methallylamine and benzylamine; and aromatic amines such as aniline, toluidine and p-aminostyrene. Examples of the polyamines include ethylenediamine, trimethylenediamine, tetramethylenediamine, hexamethylenediamine, octamethylenediamine, hexamethylenebis(2-aminopropyl)amine, diethylenetriamine, triethylenetetraamine, polyethylenepolyamine, tris(2-aminoethyl)amine, 4,4'-methylenebis(cyclohexylamine), N,N'-bis(2-aminoethyl)-1,3-propanediamine, N,N'-bis(3-aminopropyl)-1,4-butanediamine, N,N'-bis(3-aminopropyl)ethylenediamine, N,N'-bis(3-aminopropyl)-1,3-propanediamine, 1,3-cyclohexanebis(methylamine), phenylenediamine, xylilenediamine, β-(4-aminophenyl)ethylamine, diaminotoluene, diaminoanthracene, diaminonaphthalene, diaminostyrene, methylenedianiline, 2,4-bis(4-aminobenzyl)aniline and aminophenyl ether.

Furthermore, mono or polyallyl esters of allyl compounds such as mono or polycarboxylic acids, for example, formic acid, acetic acid, propionic acid, butyric acid, lauric acid, benzoic acid, chlorobenzoic acid, malonic acid, oxalic acid, glutaric acid, adipic acid, sebacic acid, phthalic acid, terephthalic acid, hexahydrophthalic acid, chlorendic acid and trimellitic acid; mono or polyallyl esters of mono or polysulfonic acids such as benzenedisulfonic acid and naphthalenedisulfonic acid; diallylamine, N,N'-diallyloxaldiamide, 1,3-diallyl urea, diallyl ether and triaryl isocyanurate may be used therefor.

Furthermore, polyvinyl compounds such as divinylbenzene, p-allylstyrene, p-isopropenylstyrene, divinylsulfone, ethylene glycol divinyl ether, glycerol trivinyl ether, divinyl succinate, divinyl phthalate and divinyl terephthalate; and acrylates or methacrylates having ionic group(s) such as 2-hydroxy-3-methacryloyloxy-propyltrimethylammonium chloride and methacryloyloxyphenyltrimethylammonium chloride may be used therefor.

Furthermore, commercially available polymerizable monomers and oligomers, for example, acrylate monomers such as Aronix M5700, M6100, M8030, M152, M205, M215, M315 and M325 (mfd. by Toa Gosei Kagaku Kogyo K.K.); acrylate or methacrylate monomers such as NK Ester ABPE-4, U-4HA, CB-1 and CBX-1 (mfd. by Shin Nakamura Kagaku Kogyo K.K.), KAYARAD R604, DPCA-30, DPCA-60, KAYAMAR PM-I and PM-2 (mfd. by Nippon Kayaku Co., Ltd.) and Photomer 4061 and 5007 (mfd. by Sun Nopco Co.); epoxyacrylates such as Ripoxy VR60, VR90 and SP1509 (mfd. by Showa High Polymer Co., Ltd.); and spirane resins having a spiroacetal structure and an acrylate or a methacrylate group such as Spirac E-4000X and U3000 (mfd. by Showa High Polymer Co., Ltd.) may be used therefor.

Either one of these compounds or a mixture thereof may be used preferably in an amount of from about 1 to 40 parts by weight, more preferably from about 2 to 30 parts by weight, based on 100 parts by weight of the solid components of the liquid light-sensitive resin composition. When the amount of the same is less than about 1 part by weight, the resulting liquid light-sensitive resin composition has a poor sensitivity. When it exceeds about 40 parts by weight, on the other hand, the resulting film has poor electrical and mechanical properties.

Examples of the compound having at least one epoxy group to be used in the present invention include glycidyl ethers of alcohols having 2 to 20 carbon atoms such as butyl glycidyl ether, octyl glycidyl ether, decyl glycidyl ether, aryl glycidyl ether and phenyl glycidyl ether; polyglycidyl ethers of polyols such as polyethylene glycol diglycidyl ether, polypropylene glycol diglycidyl ether, ethylene glycol diglycidyl ether, propylene glycol diglycidyl ether, neopentylglycol diglycidyl ether, 1,6-hexanediol diglycidyl ether, dibromoneopentylglycol diglycidyl ether, glycerol triglycidyl ether, trimethylolpropane triglycidyl ether, diglycerol tetraglycidyl ether and polyglycerol polyglycidyl ether; glycidyl ether-type epoxy compounds such as 2,6-diglycidyl phenylglycidyl ether, 2,6,2',6'-tetramethyl-4,4'-biphenyl diglycidyl ether, bisphenol A-type epoxy resins, hydrogenated bisphenol A-type epoxy resins, bisphenol F-type epoxy resins, hydrogenated bisphenol F-type epoxy resins, bisphenol S-type epoxy resins, hydrogenated bisphenol S-type epoxy resins, phenol novolak type epoxy resins, cresol novolak type epoxy resins, halogenated phenol novolak type epoxy resins and brominated epoxy resins; alicyclic epoxy compounds such as alicyclic diepoxyacetal, alicyclic diepoxyadipate, alicyclic diepoxyadipate and vinylcyclohexene dioxide; glycidyl esters of unsaturated acids such as glycidyl acrylate, glycidyl methacrylate, diglycidyl tetrahydroxyphthalate, glycidyl sorbate, glycidyl oleate and glycidyl linolenate; glycidyl esters of alkylcarboxylic acids such as butyl glycidyl ester, octyl glycidyl ester, diglycidyl hexahydrophthalate and glycidyl dimerate; glycidyl ester type epoxy compounds, for example, glycidyl esters of aromatic carboxylic acids such as glycidyl benzoate, diglycidyl o-phthalate and diglycidyl p-oxybenzoate; glycidylamine type epoxy compounds such as tetraglycidyldiaminodiphenylmethane, triglycidyl-p-aminophenol, triglycidyl-m-aminophenol, diglycidylaniline, diglycidylditoluidine, tetraglycidyl-m-xylilenediamine, diglycidyltribromaniline and tetraglycidylbisaminomethylcyclohexane; and heterocyclic epoxy compounds such as diglycidylhydantoin, glycidylglycidoxyalkylhydantoin and triglycidylisocyanurate. Among these compounds, 2,6,2',6'-tetramethyl-4,4'-biphenyl diglycidyl ether, novolak type epoxy resins and heterocyclic epoxy compounds are preferable.

Either one of these epoxy compounds or a mixture thereof may be used preferably in an amount of from about 1 to 40 parts by weight, more preferably from about 5 to 30 parts by weight, based on 100 parts by weight of the solid components of the liquid light-sensitive resin composition. When the amount of the same is less than about 1 part by weight, the resulting film is poor in strength, chemical resistance and electrical properties. When it exceeds about 40 parts by weight, on the other hand, the stability of the solution is lowered.

Examples of the photopolymerization initiator to be used in the present invention include α-diketones such as benzyl or diacetyl; acyloins such as benzoin; acyloin ethers such as benzoin methyl ether, benzoin ethyl ether and benzoin isopropyl ether; thioxanthones such as thioxanthone, 2,4-diethylthioxanthone, thioxanthone-1-sulfonic acid and thioxanthone-4-sulfonic acid; benzophenones such as benzophenone, 4,4,-bis(dimethylamino)benzophenone and 4,4'-bis(diethylamino)-benzophenone; acetophenones such as acetophenone, p-dimethylaminoacetophenone, α,α',-dimethoxyacetoxyacetophenone, 2,2,-dimethoxy-2-phenylacetophenone, p-methoxyacetophenone and 2-methyl-[4-(methylthio)-phenyl]-2-morpholino-1-propanone; quinones such as anthraquinone 1,4-naphthoquinone; halogen compounds such as phenacyl chloride, tribromomethylphenylsulfone and tris(trichloromethyl)-s-triadine; and peroxides such as di-t-butyl peroxide.

These compounds can be used either alone as the photopolymerization initiator or a mixture of two or more of them as the photopolymerization initiating system. Examples of the photopolymerization initiating system include the combination of 2,4,5-triarylimidazole dimer and 2-mercaptobenzoxazole or leuco crystal violet; the combination of 4,4-bis(dimethylamino)benzophenone and benzophenone or benzoin methyl ether as disclosed in U.S. Pat. No. 3,427,161; the combination of benzoyl-N-methyl naphtothiazoline and 2,4-bis(trichloromethyl)-6,4-methoxyphenyl triazole as disclosed in U.S. Pat. No. 4,239,850; and the combination of dimethylthioxanthone and 4-dialkylaminobenzoate as disclosed in JP-A-57-23602.

These photopolymerization initiators or photopolymerization initiating system may be used preferably in an amount of from about 0.1 to 20 parts by weight, more preferably from about 0.2 to 10 parts by weight, based on the solid components of the liquid light-sensitive resin composition. When the amount of the same is less than about 0.1 part by weight, the resulting liquid light-sensitive resin composition has a poor sensitivity. When it exceeds about 20 parts by weight, on the other hand, the resulting liquid light-sensitive resin composition suffers from some problems such as the precipitation of crystals or insufficient hardening of the lower part.

As the thermohardening catalyst for catalyzing the thermal reaction of the epoxy group, known epoxy-hardening accelerators may be used. Examples thereof include amines, for example, aliphatic primary amines, for example, polyamines such as diethylenetriamine, triethylenetetramine, tetraethylenepentamine, iminobispropylamine (dipropyltriamine), bis(hexamethylene)-triamine and 1,3,6-trisaminomethylhexane, polymethylenediamines such as trimethylhexamethylenediamine, polyetherdiamine and diethylaminopropylamine, and alicyclic polyamines such as menthenediamine, isophoronediamine, bis(4-amino-3-methylcyclohexyl)methane and N-aminoethylpiperazine; aromatic primary amines such as methaphenylenediamine, diaminophenylmethane, diaminophenylsulfone and eutectic mixtures of aromatic diamines; modified amines such as polyamine epoxy resin adducts, polyamine-ethylene oxide adduct, polyamine-propylene oxide adduct, cyanoethylated polyamine and ketoimine; secondary amines such as piperidine, piperazine and morpholine; and tertiary amines such as tetramethylguanidine, triethanolamine, benzyldimethyl-amine and 2,4,6-tris(-dimethylaminomethyl)phenol; acid anhydrides, for example, aromatic acid anhydrides such as phthalic anhydride, trimellitic anhydride, ethylene glycol bis(anhydrotrimellitate), glycerol tris(anhydrotrimellitate), pyromellitic anhydride and 3,3',4,4'-benzophenone tetracarboxylic anhydride; alicyclic acid anhydrides such as maleic anhydride, succinic anhydride, tetrahydrophthalic anhydride, methyltetrahydro phthalic anhydride, endomethylenetetrahydrophthalic anhydride, methylendomethylenetetrahydrophthalic anhydride, alkenylsuccinic anhydride, hexahydrophthalic anhydride, methylhexahydrophthalic anhydride and methylcyclohexenetetracarboxylic anhydride; aliphatic acid anhydrides such as polyadipic anhydride, polyazelaic anhydride and polysebacic anhydride; and halogenated acid anhydrides such as chlorendic anhydride and tetrabromophthalic anhydride; imidazole compounds such as 2- methylimidazole, 2-ethyl-4-methylimidazole, 2-undecylimidazole, 2-heptadecylimidazole, 2-phenylimidazole, 1-benzyl-2-methylimidazole, 1-cyanoethyl-2-methylimidazole, 1-cyanoethyl-2-ethyl-4-methylimidazole, 1-cyanoethyl-2-undecylimidazole, 1-cyanoethyl-2-undecylimdazo trimellitate, 1-cyanoethyl-2-phenylimidazolium trimellitate, 2-methylimidazolium isocyanurate, 2-phenylimidazolium isocyanurate, 2,4-diamino-6-[2-methylimidazolyl-(1)]-ethyl-S-triazine, 2,4-diamino-6-[2-ethyl-1)]-ethyl-S-triazine, 2,4-diamino-6-[2-undecylimidazolyl-(1)]-ethyl-S-triazine, 2-phenyl-4-methyl-5-hydroxymethylimidazole, 2-phenyl-4,5-dihydroxymethylimidazole, 1-cyanoethyl-2-phenyl-4,5-di(cyanoethoxy-methyl)imidazole, 1-dodecyl-2-methyl-3-benzylimidazolium chloride and 1,3-dibenzyl-2-methylimidazolium chloride; phenols such as novolak type phenol resins, cresol type phenol resins, resorcinol type phenol resins and polyvinylphenol; Lewis acid/amine complexes such as boron trifluoride/amine complex, boron pentafluoride/amine complex and arsenic pentafluoride/amine complex; dicyandiamides such as dicyandiamide, o-tolylbiguanide, phenylbiguanide and α-2,5-dimethylbiguanide; organic acid hydrazides such as succinic acid hydrazide, adipic acid hydrazide, isophthalic acid hydrazide and p-oxybenzoic acid hydrazide; diaminomaleonitrile derivatives such as diaminomaleonitrile and benzyl diaminomaleonitrile; melamine derivatives such as melamine and N,N-diarylmelamine; amineimide derivatives and polymercaptanes.

One of these thermohardening catalysts or a mixture thereof may be used preferably in an amount of from about 0.01 to 10 parts by weight, more preferably from about 0.05 to 5 parts by weight, based on 100 parts by weight of the solid components of the liquid light-sensitive resin composition. When the amount of the same is less than about 0.01 part by weight, the resulting film shows an insufficient strength. When it exceeds about 10 parts by weight, on the other hand, the resulting liquid light-sensitive resin composition suffers from some problems such as precipitation of crystals or a decrease in the stability of the liquid.

Examples of the organic solvent to be used in the present invention include ketones such as methyl ethyl ketone and cyclohexanone; aromatic hydrocarbons such as toluene and xylene; ethylene glycol monoethyl-ethers such as ethylene glycol monoethylether and butyl ethylene glycol monoethylether; diethylene glycol monoethylethers such as diethylene glycol monoethylether acetate and butyl diethylene glycol monoethylether acetate; and acetates such as ethyl acetate, butyl acetate, ethylene glycol monoethylether acetate, butyl ethylene glycol monoethylether acetate, diethylene glycol monoethylether acetate and butyl diethylene glycol monoethylether acetate.

These organic solvents may be used preferably in an amount of from about 10 to 50 parts by weight, more preferably from about 20 to 40 parts by weight, based on 100 parts by weight of the liquid light-sensitive resin composition. When the amount of the same is less than about 10 parts by weight, the viscosity of the resulting liquid light-sensitive resin composition is excessively high. When it exceeds about 50 parts by weight, on the other hand, the viscosity of the resulting liquid light-sensitive resin composition is excessively low. In each case, the workability of the liquid light-sensitive resin composition is deteriorated.

The liquid light-sensitive resin composition of the present invention preferably comprises a thermal polymerization inhibitor to thereby prevent polymerization upon drying. Examples of the thermal polymerization inhibitor include aromatic hydroxy compounds such as hydroquinone, p-methoxyphenol, p-t-butylcatechol, 2,6-di-t-butyl-p-cresol, β-naphthol and pyrogallol; quinones such as benzoquinone and p-tolquinone; amines such as naphthylamine, pyridine, p-toluidine and phenothiazine; aluminum or ammonium salt of N-nitrosophenylhydroxylamine, phloranyl and nitrobenzene.

Furthermore, the liquid light-sensitive resin composition of the present invention may comprise various additives such as tackifiers, adhesion promoters, dispersants, plasticizers, anti-sagging agents, leveling agents, anti-foaming agents, flame-retardants, gloss agents and colorants, if required.

Examples of the tackifier or adhesion promoter include alkylphenol/formaldehyde novolak resins, polyvinyl ethyl ether, polyvinyl isobutyl ether, polyvinyl butylal, polyisobutylene, styrene/butadiene copolymer rubber, butyl rubber, vinyl chloride/vinyl acetate copolymer, chlorinated rubbers, acrylic resin tackifiers and aromatic, aliphatic or alicyclic petroleum resins.

The addition of the tackifier or adhesion promoter would enhance the adhesion of the light-sensitive resin to a substrate after photohardening. This treatment is particularly effective when the liquid light-sensitive resin composition is to be applied to copper and solder printed circuit boards.

The dispersant is added in order to improve, for example, the dispersibility and storage stability of the liquid light-sensitive resin composition. The plasticizer, anti-sagging agent, leveling agent and anti-foaming agent may be added depending on the application of the liquid light-sensitive resin composition, namely, the film-formation process of the same. The type and amount of each additive may be appropriately selected.

It is sometimes observed that one of these additives would exert two or more effects selected from among dispersibility, plasticizing performance, anti-sagging effect, leveling effect and anti-foaming effect. For example, a dispersant would sometimes act as a plasticizer, a leveling agent and an anti-foaming agent on the liquid light-sensitive resin composition. Furthermore, a dispersant, an anti-sagging agent, a leveling agent and an anti-foaming agent would sometimes improve the gloss of the liquid light-sensitive resin composition after photohardening. Namely, they would also be effective as a gloss agent.

Examples of the dispersant include fluorinecontaining polymer compounds, surfactants, modified lecithin, nonsilicone long-chain carboxylic acid amine salts and organic montmorillonite.

Examples of the plasticizer include glycol esters such as ethylene glycol diphthalate, diethylene glycol diphthalate, ethylene glycol dicaprate and diethylene glycol dicaprate; phthalates such as dimethyl phthalate, diethyl phthalate, dibutyl phthalate, dioctyl phthalate, diaryl phthalate and butyl benzyl phthalate; phosphates such as triphenyl phosphate and tricrezyl phosphate; diethyl malate, dibutyl adipate, triethyl citrate and ethyl laurate.

Examples of the anti-sagging agent include inorganic fine powders such as talc, mica, silicon dioxide, titanium dioxide, calcium carbonate, magnesium carbonate, barium carbonate, calcium sulfate, magnesium sulfate and barium sulfate Examples of the colorant include inorganic pigments such as titanium oxide, carbon black and iron oxide; organic dyes such as methylene blue, crystal violet, rhodamine B, fuchsine, auramine, azo dyes and anthraquinone dyes; and phthalocyanine or azo organic pigments such as phthalocyanine blue or phthalocyanine green.

Examples of the flame-retardant include inorganic flame-retardants such as antimony trioxide, zirconium hydroxide, barium metaborate, magnesium hydroxide and aluminum hydroxide; halogen flame-retardants such as tetrabromobisphenol A, chlorinated paraffin, perchloropentacyclodecane, tetrabromobenzene and chlorinated diphenyl; and phosphorus flame-retardants such as vinyl phosphonate, aryl phosphonate, tris(β-chloroethyl) phosphonate, tricrezyl phosphonate and ammonium phosphate.

The liquid light-sensitive resin composition of the present invention thus obtained may be used in the formation of an image in the following manner. Namely, the liquid light-sensitive resin composition is applied to a substrate and then hardened by heating to thereby make the surface tack-free. Next, a pattern mask is adhered to the film thus obtained followed by exposure. Then it is developed with the use of an alkaline aqueous solution. After removing the unhardened film, the desired image is obtained.

The liquid light-sensitive resin composition of the present invention may be applied to a substrate by, for example, spraying, dipping, brushing, roller-painting, flow-coating, curtain-coating or screen-printing. When it is to be applied to a printed circuit board or a metallic film, roller-painting, curtain-coating and screen-printing are preferable.

The liquid light-sensitive resin composition of the present invention may be subjected to either photohardening or thermal hardening. When it is to be used as a photoresist, the coating film is thermally hardened, prior to the irradiation of active light, to thereby remove the tackiness of the surface of the coating film. This thermal hardening may be preferably conducted, for example, at 70 to 120 °C. for 5 to 30 minutes. As a result, the film becomes tack-free, which makes it possible to adhere a pattern mask to the hardened film followed by exposure.

Examples of the exposure light source to be used in the photohardening of the liquid light-sensitive resin composition of the present invention include a low pressure mercury lamp, a moderate pressure mercury lamp, a high pressure mercury lamp, an ultrahigh pressure mercury lamp, a xenon lamp, a metal halide lamp and a laser. It is particularly preferable to use a device wherein a high pressure mercury lamp, an ultra high pressure mercury lamp or a metal halide lamp radiating UV light of a wavelength of approximately 300 to 400 nm is employed as a light source.

The liquid light-sensitive resin composition of the present invention can be developed with an alkali aqueous solution. Examples of the development solution include 0.1 to 10 % by weight aqueous solutions of sodium hydroxide, potassium hydroxide, lithium hydroxide, sodium carbonate, potassium carbonate, lithium carbonate and ammonia. Furthermore, amines, for example, primary amines such as butylamine, hexylamine, benzylamine and arylamine; secondary amines such as diethylamine and benzylethylamine; tertiary amines such as triethylamine; hydroxylmmines such as ethanolamine, diethanolamine, triethanolamine and 2- amino-1,3-propanediol, cyclic amines such as morpholine, pyridine, piperazine and piperidine and polyamines such as hydrazine, ethylenediamine and hexamethylenediamine; basic salts of the above-mentioned amines such as sulfates, carbonates, hydrogencarbonates, alkali metal phosphates and pyrophosphates thereof and quaternary ammonium salt hydroxides such as tetramethylammonium hydroxide and choline may be used therefor.

Furthermore, the liquid light-sensitive resin composition of the present invention may be further subjected to post-hardening by heating, if required, after the formation of the image. Thus the thermal resistance of the film can be further improved. This post-hardening may be conducted by, for example, heating the liquid light-sensitive resin composition to 120 to 170 ° C. for 10 t 60 minutes.

The heating for the hardening prior to the exposure and the post-hardening after the formation of the image may be conducted with the use of an appropriate heating unit such as an oven with internal air circulation or a far infrared ray oven.

To further illustrate the present invention, and not by way of limitation, the following Examples will be given, wherein all parts are by weight unless otherwise noted.

SYNTHETIC EXAMPLE 1

100 parts of Resin ML (poly(4-vinylphenol) mfd. by Maruzen Oil Co., Ltd.), 116 parts of glycidyl methacrylate and 0.15 part of phenothiazine were dissolved in 144 parts of diethylene glycol monoethylether acetate. Then 1.9 part of benzyltriethylammonium chloride was added thereto and the resulting mixture was stirred at 80 ° C. for 12 hours.

After adding 120.2 parts of tetrahydrophthalic anhydride, the resulting reaction mixture was stirred at 80° C. for 4 hours. Thus a modified polystyrene resin 1 was obtained.

SYNTHETIC EXAMPLE 2

The procedure of Synthetic Example 1 was repeated except that 144 parts of the diethylene glycol monoethyl ether acetate and 120.2 parts of the tetrahydrophthalic anhydride were respectively replaced with 127 part of diethylene glycol monoethyl ether acetate and 79 parts of succinic anhydride. Thus a modified polystyrene resin.2 was obtained.

SYNTHETIC EXAMPLE 3

100 parts of Epiclon N-673 (cresol novolak type epoxy resin mfd. by Dainippon Ink & Chemicals, Inc.), 35.7 parts of acrylic acid and 0.07 part of hydroquinone were dissolved in 88.8 parts of diethylene glycol monoethyl ether acetate. After adding 1.07 part of benzyltriethylammonium chloride, the resulting mixture was stirred at 80 ° C. for 12 hours.

After adding 70.4 parts of tetrahydrophthalic anhydride, the reaction mixture was stirred at 80 ° C. for 4 hours to thereby give a polymerizable resin 3.

SYNTHETIC EXAMPLE 4

The procedure of Synthetic Example 3 was repeated except that 88.8 parts of the diethylene glycol monoethyl ether acetate was replaced with 78.4 parts of the same while 70.4 parts of the tetrahydrophthalic anhydride was replaced with 46.2 parts of succinic anhydride. Thus a polymerizable resin 4 was obtained.

SYNTHETIC EXAMPLE 5

100 parts of a vinyl polymer of 4-vinylphenylglycidyl ether, 51.3 parts of methacrylic acid 70 wt % diethylene glycol monoethylether acetate solution of and 0.11 part of phenothiazine were dissolved in 101.7 parts of diethylene glycol monoethylether acetate. After adding 1.3 parts of benzyltriethylammonium chloride, the resulting mixture was stirred at 80° C. for 12 hours.

After adding 84.6 parts of tetrahydrophthalic anhydride, the reaction mixture was stirred at 80° C. for 4 hours to thereby give a modified polystyrene resin 5.

SYNTHESTIC EXAMPLE 6

The procedure of Synthetic Example 5 was repeated except that 101.7 parts of the diethylene glycol monoethylether acetate was replaced with 89.3 parts of the same while 84.6 parts of the tetrahydrophthalic anhydride was replaced with 55.7 parts of succinic anhydride. Thus a modified polystyrene resin 6 was obtained.

EXAMPLE 1

| | |
|---|---|
| <Component M-1> | |
| modified polystyrene resin 1 obtained in Synthetic Example 1 | 350 parts |
| Floren AC-300 (anti-foaming agent mfd. by Kyoeisha Yushi Kagaku Kogyo K.K.) | 15 parts |
| phthalocyanine green | 2.5 parts |
| IRGAGURE 907 (photopolymerization initiator mfd. by Ciba-Geigy A.G.) | 27.5 parts |
| silica | 5 parts |
| barium sulfate | 90 parts |
| 1-benzyl-2-methylimidazole | 10 parts |
| Total | 500 parts. |
| <Component N-1> | |
| triglycidyl isocyanurate | 100 parts |
| dipentaerythritol hexaacrylate | 36 parts |
| talc | 14 parts |
| ethylene glycol monoethylether acetate | 50 parts |
| Total | 200 parts |

The above components M-1 and N-1 were separately kneaded in a roll mill to thereby give ink compositions.

Then the components M-1 and N-1 were kneaded together to thereby give a liquid light-sensitive resin composition.

COMPARATIVE EXAMPLE 1

The procedure of Example 1 was repeated except that the modified polystyrene resin 1 was replaced with the polymerizable resin 3 obtained in Synthetic Example 3. Thus a liquid light-sensitive resin composition was obtained.

EXAMPLE 2

The procedure of Example 1 was repeated except that the modified polystyrene resin 1 was replaced with the modified polystyrene resin 2 obtained in Synthetic Example 2. Thus a liquid light-sensitive resin composition was obtained.

COMPARATIVE EXAMPLE 2

The procedure of Example 1 was repeated except that the modified polystyrene resin 1 was replaced with the polymerizable resin 4 obtained in Synthetic Example 4. Thus a liquid light-sensitive resin composition was obtained.

The performances of these liquid light-sensitive resin compositions were evaluated by the following methods. Table 1 summarizes the results.

(1) Film-formation

Copper-clad laminates were preliminarily abraded, washed and dehydrated. On the entire surfaces of these pretreated copper-clad laminates, the liquid light-sensitive resin compositions prepared in Examples 1 to 4 and Comparative Examples 1 and 2 were applied by screen-printing and then dried in an oven with internal air circulation at 70° C. for 30 minutes to thereby give films.

(2) Evaluation of development performance

Each film was developed under the following conditions and the time required for dissolving the film was measured:

developing solution: 1 % aqueous solution of sodium carbonate,
solution temperature: 25 ° C.,
spray pressure: 1.8 kg/cm$^2$.

(3) Evaluation of sensitivity

A stepwise wedge (difference in optical density 0.15 ($\Delta$log E)) was adhered to a film and exposed to a 5 KW ultra-high pressure mercury lamp at 1000 mj/cm$^2$. Then it was developed within a time twice as long as the time required for dissolving the unexposed area to thereby give a negative corresponding to the step wedge. Thus the number of steps for completely eluting the image (number of clearance steps) was examined.

(4) Evaluation of pencil hardness

Development was conducted in the same manner as the one described in (3) at such an exposure dose as to give a number of clearance steps of 12 followed by post-hardening in an oven with internal air circulation at 140° C. for 50 minutes. Then the pencil hardness was determined according to JIS K 5400 6-14.

(5) Evaluation of adhesion

Exposure, development and post-hardening were conducted in the same manner as the one described in the evaluation of pencil hardness. Then a checkerboard test was conducted according to JIS K 5400 6-15.

(6) Evaluation of electrical insulating resistance

Exposure, development and post-hardening were conducted in the same manner as the one described in the evaluation of pencil strength, except that double copper-clad laminates having an IPC-B-25 test pattern were used. Then the electrical insulating resistance was determined according to JIS Z 3197 by applying DC500 V with TR-8601 (mfd. by Advantest K.K.) within 1 minute.

(7) Evaluation of solvent resistance

Exposure, development and post-hardening were conducted in the same manner as the one described in the evaluation of electrical insulating resistance. Each sample was immersed in 1,1,1-trichloroethane at 20° C. for 1 hour and then the conditions and adhesion of the film were totally evaluated.

(8) Evaluation of acid resistance

Exposure, development and post-hardening were conducted in the same manner as the one described in the evaluation of solvent resistance. Each sample was immersed in a 10 % by volume aqueous solution of sulfuric acid at 20° C. for 30 minutes and then the conditions and adhesion of the film were totally evaluated.

TABLE 1

| | Performance of liquid light-sensitive resin composition | | | | | | |
|---|---|---|---|---|---|---|---|
| | Development (second) | Sensitivity (step) | Pencil hardness | Adhesion | Insulating resistance | Solvent resistance | Acid resistance |
| Example 1 | 8 | 14 | 5H | 100/100 | $6.3 \times 10^{13}$ | Good | Good |
| Comparative Example 1 | 10 | 10 | 5H | 100/100 | $2.7 \times 10^{13}$ | Good | Good |
| Example 2 | 7 | 13 | 5H | 100/100 | $7.0 \times 10^{12}$ | Good | Good |
| Comparative Example 2 | 3 | 13 | 6H | 100/100 | $1.5 \times 10^{12}$ | Good | Poor |

EXAMPLE 3

70 wt% diethylene glycol monoethylether acetate solution

| <Component M-2> | |
|---|---|
| 70 wt % diethylene glycol monoethylether acetate solution of modified polystyrene resin 5 obtained in Synthetic Example 5 | 350 parts |
| Floren AC-300 (anti-foaming agent mfd. by Kyoeisha Yushi Kagaku Kogyo K.K.) | 15 parts |
| phthalocyanine green | 2.5 parts |
| IRGAGURE 907 (photopolymerization initiator mfd. by Ciba-Geigy A.G.) | 27.5 parts |
| silica | 5 parts |
| barium sulfate | 90 parts |
| 1-benzyl-2-methylimidazole | 10 parts |
| Total | 500 parts. |
| <Component N-2> | |
| triglycidyl isocyanurate | 100 parts |
| dipentaerythritol hexaacrylate | 36 parts |
| talc | 14 parts |
| ethylene glycol monoethylether acetate | 50 parts |
| Total | 200 parts |

The above components M-2 and N-2 were separately kneaded in a roll mill to thereby give ink compositions.

Then the components M-2 and N-2 were kneaded together to thereby give a liquid light-sensitive resin composition.

EXAMPLE 4

The procedure of Example 3 was repeated except that the modified polystyrene resin 5 was replaced with the modified polystyrene resin 6 obtained in Synthetic Example 6. Thus a liquid light-sensitive resin composition was obtained.

The performances of these liquid light-sensitive resin compositions were evaluated by the methods as described above. Table 2 summarizes the results.

TABLE 2

| | Performance of liquid light-sensitive resin composition | | | | | | |
|---|---|---|---|---|---|---|---|
| | Development (second) | Sensitivity (step) | Pencil hardness | Adhesion | Insulating resistance | Solvent resistance | Acid resistance |
| Example 3 | 9 | 14 | 5H | 100/100 | $5.3 \times 10^{13}$ | Good | Good |
| Comparative Example 1 | 10 | 10 | 5H | 100/100 | $2.7 \times 10^{13}$ | Good | Good |
| Example 4 | 7 | 13 | 5H | 100/100 | $7.0 \times 10^{12}$ | Good | Good |
| Comparative Example 2 | 3 | 13 | 6H | 100/100 | $1.5 \times 10^{12}$ | Good | Poor |

These Examples obviously indicate that the liquid light-sensitive resin composition of the present invention can be applied onto a printed circuit board, dried by heating so as to make it tack-free and contacted to a pattern mask followed by exposure. In addition, it is highly sensitive and enables the development with an alkaline aqueous solution.

Furthermore, the liquid light-sensitive resin composition of the present invention is excellent in electrical and mechanical properties as well as chemical resistance after thermal hardening. Thus it is available as a permanent protective mask for printed circuit boards.

While the invention has been described in detail and with reference to specific examples thereof, it will be apparent to one skilled in the art that various changes and modifications can be made therein without departing from the spirit and scope thereof.

What is claimed is:

1. A liquid light-sensitive resin composition consisting essentially of the following components:
   (A) a modified polystyrene resin which has at least one styrene unit having at least one ethylenic unsaturated double bond and at least one carboxyl group wherein said modified polystyrene resin is present in an amount of from about 10 to 60 parts by weight based on 100 parts by weight of the solid components of said liquid light-sensitive resin composition;
   (B) a polymerizable compound having at least one ethylenic unsaturated double bond which is different from Component (A) and wherein said polymerizable compound is present in an amount of from about 1 to 40 parts by weight based on 100 parts by weight of the solid components of said liquid light-sensitive resin composition;
   (C) a compound having at least one epoxy group and having no ethylenic unsaturated double bond, wherein said component is present in an amount of from about 1 to 40 parts by weight based on 100 parts by weight of the solid components of said liquid light-sensitive resin composition;
   (D) a photopolymerization initiator or a photopolymerization initiating system wherein said photopolymerization initiator or said photopolymerization initiating system is present in an amount of from about 0.1 to 20 parts by weight based on 100 parts by weight of the solid components of said liquid light-sensitive resin composition;
   (E) a thermohardening catalyst capable of inducing a thermal reaction of said at least one epoxy group wherein said thermohardening catalyst is present in an amount of from about 0.01 to 10 parts by weight based on 100 parts by weight of the solid components of said liquid light-sensitive resin composition; and
   (F) an organic solvent which is different from components (B) and (C) above and wherein said organic solvent is present in an amount of form about 10 to 50 parts by weight based on 100 parts by weight of said liquid light-sensitive resin composition.

2. A liquid light-sensitive resin composition as claimed in claim 1, wherein said modified polystyrene resin is:
   (A-1) a modified polystyrene resin obtained by reacting a polymer having a repeating unit of the following general formula (I):

wherein R represents a hydrogen atom or a methyl group;
   and Ar represents an unsubstituted or substituted phenylene group;
   successively with a compound having an epoxy group and an ethylenic unsaturated double bond in a single molecule in an amount of from about 0.5 to 1.2 equivalent(s) per equivalent of the hydroxyl group in said polymer having a repeating unit of general formula (I) and a saturated or unsaturated polybasic acid anhydride in an amount of from bout 0.1 to 1.1 equivalent(s) per equivalent of the hydroxyl group in said polymer having a repeating unit of general formula (I).

3. A liquid light-sensitive resin composition as claimed in claim 1, wherein said modified polystyrene resin is:
   (A-2) a modified polystyrene resin obtained by reacting a polymer having a repeating unit of the following general formula (II);

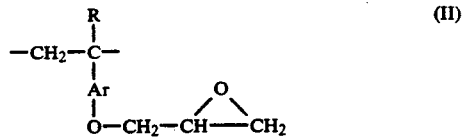

wherein R represents a hydrogen atom or a methyl group;
   and Ar represents an unsubstituted or substituted phenylene group;
   successively with a compound having a carboxyl group and an ethylenic unsaturated double bond in a single molecule in an amount of from about 0.5 to 1.2 equivalent(s) per equivalent of the hydroxyl group in said polymer having a repeating unit of general formula (II) and a saturated or unsaturated polybasic acid anhydride in an amount of from about 0.1 to 1.1 equivalent(s) per equivalent of the hydroxyl group in said polymer having a repeating unit of general formula (II).

4. A liquid light-sensitive resin composition as in claim 2, wherein said compound having an epoxy group and an ethylenic unsaturated double bond in a single molecule is a compound selected from the group consisting of glycidyl acrylate and glycidyl methacrylate and said saturated or unsaturated polybasic acid anhydride is a compound selected from the group consisting of succinic anhydride and tetrahydrophthalic anhydride.

5. A liquid light-sensitive resin composition as claimed in claim 3, wherein said compound having a carboxyl group and an ethylenic unsaturated double bond in a single molecule is a compound selected from the group consisting of acrylic acid, methacrylic acid and dimers, trimers and higher polymers of acrylic acid and said saturated or unsaturated polybasic acid anhydride is a compound selected from the group consisting of succinic anhydride and tetrahydrophthalic anhydride.

* * * * *